United States Patent
Wötting et al.

(10) Patent No.: US 6,916,560 B2
(45) Date of Patent: Jul. 12, 2005

(54) SILICON NITRIDE BASED SUBSTRATE FOR SEMI-CONDUCTOR COMPONENTS

(75) Inventors: Gerhard Wötting, Coburg (DE); Peter Woditsch, Krefeld (DE); Christian Hässler, Shanghai (CN); Gunther Stollwerck, Krefeld (DE)

(73) Assignee: H. C. Starck Ceramics GmbH & Co. KG, Selb (DE)

( * ) Notice: Subject to any disclaimer, the term of this patent is extended or adjusted under 35 U.S.C. 154(b) by 0 days.

(21) Appl. No.: 10/433,632

(22) PCT Filed: Nov. 22, 2001

(86) PCT No.: PCT/EP01/13598

§ 371 (c)(1),
(2), (4) Date: Oct. 9, 2003

(87) PCT Pub. No.: WO02/46121

PCT Pub. Date: Jun. 13, 2002

(65) Prior Publication Data

US 2004/0053769 A1 Mar. 18, 2004

(30) Foreign Application Priority Data

Dec. 4, 2000 (DE) .......................................... 100 60 221

(51) Int. Cl.⁷ .......................... B32B 9/04; B32B 18/00; C04B 35/565
(52) U.S. Cl. ........................ 428/698; 428/446; 428/448; 501/92; 501/97.4
(58) Field of Search ................................ 428/698, 446, 428/448; 501/92, 97.4

(56) References Cited

U.S. PATENT DOCUMENTS 4,351,787 A * 9/1982 Martinengo et al. ........ 264/647
5,134,097 A * 7/1992 Niihara et al. ................ 501/92
5,380,372 A   1/1995 Campe et al. ............... 136/258
5,523,267 A * 6/1996 Tanaka et al. ................ 501/92

FOREIGN PATENT DOCUMENTS

EP          831 077         3/1998
WO          00/32537        6/2000

OTHER PUBLICATIONS

*C.Hebling et al.: "Dunnschichtsolarzellen aus kristallinem Silicium" Spektrum der Wissenschaft, No. 2, –Feb. 1999 p. 10–12, XP001040732 cited in the application p. 10, col. 3, paragraph 4 –p. 11, col. 1, paragraph 2, (German only).

Y.W. Kim et al (Mater. Res. Soc. Symp. Proc., (month unavailable) 1993, vol. 287, pp 265–270) "Tape Casting of Silicon Nitride" Structural Ceramics Lab., Korea Institute of Science and Technology.

* cited by examiner

Primary Examiner—Stephen Stein
(74) Attorney, Agent, or Firm—Joseph C. Gil; James R. Franks

(57) ABSTRACT

The invention relates to a silicone nitride based substrate for semi-conductor components, said substrate containing silicon nitride ($Si_3N_4$), silicon carbide (SIC) and silicon oxynitride ($Si_2N_2O$) as crystalline phases. The silicon phase content is less or equal to 5%, the shrinkage during production is less than 5% and the open porosity of the substrate is less than 15% vol. %. The invention also relates to a method for the production and use of said substrate as an element of semi-conductor components, particularly thin film solar cells, and semi-conductor components which contain said substrate.

11 Claims, 1 Drawing Sheet

SILICON NITRIDE BASED SUBSTRATE FOR SEMI-CONDUCTOR COMPONENTS

Figure 1:
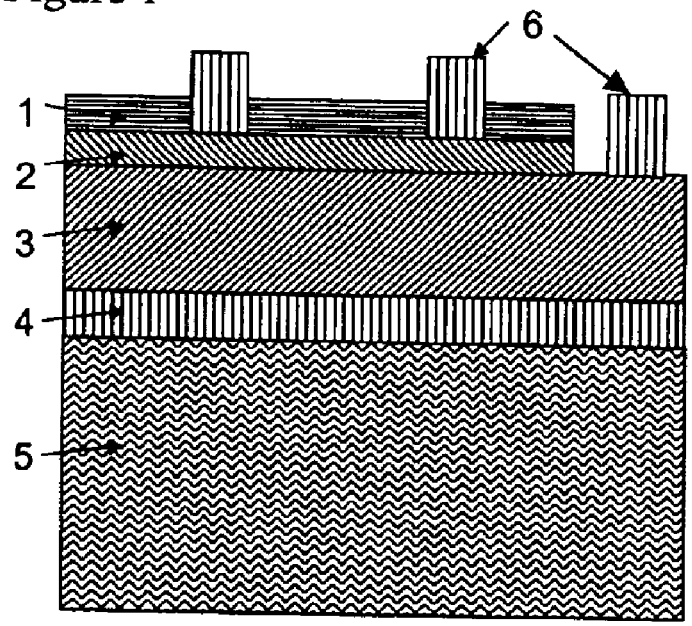

The invention relates to a substrate based on silicon nitride for semiconductor components, to the production of this substrate, to the use of the substrate for producing semiconductor components and to semiconductor components which include the substrate.

The term substrate is understood as meaning a planar or structured, sheet-like part with a thickness of preferably <3 mm.

The photovoltaics sector is currently dominated by the technology of crystalline silicon. Large polycrystalline silicon blocks with weights of over 200 kg are divided into individual wafers, which have surface areas of 10×10 $cm^2$ to 15×15 $cm^2$ with a thickness of approx. 300 μm. These wafers can be used to produce solar cells. Well-controlled crystallization and suitably adapted processes for producing solar cells currently achieve efficiencies of up to 15% for solar cells which are produced on an industrial scale.

However, a drawback of this type of solar cell is that during the dividing of the polycrystalline silicon blocks, there are considerable losses of expensive crystalline silicon. Moreover, for stability reasons the silicon wafers have to have a relatively great thickness, which in turn entails a high consumption of crystalline silicon. As part of the ongoing attempts to provide less expensive alternatives to this type of solar cells, thin-film techniques have been developed, in which semiconductor layers which are generally only a few μm thick are used. In addition, the thin-film technology has the advantage that solar cells which have already been monolithically wired can be deposited, and therefore there is no need for subsequent soldering of the individual cells.

Drawbacks of the thin-film technologies currently reside primarily in the area of the efficiencies which can be achieved on large surfaces in the $m^2$ range, which are of relevance to photovoltaics modules.

The material systems used for thin-film solar cells are, in detail, copper indium diselenide ($CuInSe_2$, CIS), cadmium telluride (CdTe), amorphous silicon (a-Si), gallium arsenide (GaAs) and crystalline thin-film silicon.

The use of GaAs makes it possible to produce solar cells with extremely high efficiencies (>30%), but the technology and materials used mean that these cells are very expensive, and consequently this type of solar cell remains limited to special locations, e.g. in space. High efficiencies up to 18% on small surfaces have also been demonstrated for the material systems CdTe and CIS, but hitherto it has still proven difficult to realize these efficiencies on large areas of 0.1–1 $m^2$. Layer inhomogenities reduce the efficiency in these applications, with a correspondingly reduced yield, to 10–12%. Additional drawbacks of the CdTe and CIS systems lie in the availability of the materials, which is considerably more limited than that of silicon, and the as yet uncertain environmental pollution caused by large-scale use of these types of solar cells.

Therefore, thin films of amorphous and crystalline silicon have remained the most available and environmentally friendly material systems. On account of the defect-rich structure of amorphous silicon, thin-film solar cells with an amorphous silicon layer have hitherto only been able to achieve efficiencies of 8% (in industrial production of large surface areas). By contrast, with thin-film solar cells with a thin film of crystalline silicon, which has fewer defects, the advantages of the silicon material system can be combined with the potential for good efficiencies.

For example, a thin-film solar cell with an efficiency of 19.2% is described in Spektrum der Wissenschaft, February 1999, 10–12. The photovoltaically active crystalline silicon layer was deposited on a pretreated silicon substrate using a complex process. Then, a pattern of inverted pyramids was produced on the surface.

However, the thin-film solar cell described is only an optimized laboratory model. It has not so far been possible to produce thin-film solar cells of this type on a large industrial scale. It is specifically stated that constructing a thin-film solar cell from crystalline silicon throws up a number of difficult problems which thus far have only been solved partially and under laboratory conditions.

The main problem with the development of thin-film solar cells from crystalline silicon consists in resolving the substrate question. The following principal demands are imposed on the substrate material in this context:

Thermal stability up to at least 1100° C. (deposition temperature), preferably up to approx. 1400° C. (melting point of silicon).

Coefficient of thermal expansion from room temperature up to the deposition temperature similar to that of silicon, in order to suppress thermal stresses and therefore ensure bonding of the thin film of silicon.

Minimum introduction of impurities from the substrate material into the silicon layer, in particular with regard to transition metals. The efficiency of solar cells based on silicon decreases considerably even when metallic impurities are present in the ppba range.

To summarize, it is necessary for it to be possible to deposit low-defect silicon layers for producing high-efficiency solar cells, and this requirement, together with the further significant requirement for it to be possible for the substrates to be produced with a large surface area and at low cost and to be used directly without expensive further treatment, has hitherto been satisfied only to an insufficient extent. Hitherto, investigations have focused on, for example, substrate materials made from silicon itself, graphite and ceramic materials, such as mullite, $Al_2O_3$, SiC, and $Si_3N_4$ (Spektrum der Wissenschaft, February 1999, 10–12; Proc. of European Photovoltaic Solar Energy Conference, Glasgow, May 2000).

EP 831 077 A1 has disclosed a support wafer for a solar cell which includes a ceramic substrate layer based on reaction-bonded silicon carbide, a covering layer of crystalline silicon and if appropriate a barrier layer arranged between these two layers. However, this means that the material is limited to SiC, which generally has semiconducting properties. Also, the reaction bonding and the formation of the silicon covering layer have to be carried out in a single heat treatment step in order to produce the support wafer, and this greatly restricts the options for targeted adjustment of the properties of the material of the support wafer. Furthermore, no measures are taken to deliberately adjust the coefficient of thermal expansion (CTE) or the electrical conductivity, and no statements are known as to the quality of thin-film solar cells which are produced from this support wafer.

EP 536 682 A2 describes a semiconductor component, for example a thin-film solar cell, which has a support, contacts and at least one semiconductor layer which is present between these two and a nucleation layer which is arranged between the semiconductor layer and the support. The support may consist of any desired material, preferably with a coefficient of thermal expansion similar to that of silicon. An example mentioned as a suitable support is graphite. First of all, a conductive intermediate layer has to be applied to the support, followed by a nucleation layer and finally the photovoltaically appropriate layer. A drawback of using any desired support is that the support has to be sealed on the side facing the nucleation layer or a sealing intermediate layer has to be applied between the support and the nucleation layer. No details are given as to the efficiencies which can be achieved with correspondingly structured thin-film solar cells.

The object of the present invention was to provide a substrate for semiconductor components, in particular for thin-film solar cells, on which it is possible to deposit low-defect silicon wafers for producing high-efficiency solar cells, which can be produced with a large surface area and at low cost and can be used directly without the need for expensive further treatment.

In the efforts to provide a substrate which satisfies the abovementioned requirements and allows a very wide range of possible adjustments to varied and/or further requirements as a result of its composition and/or production process being modified, it has surprisingly been discovered that a $Si_3N_4$-based material which through induction has a shrinkage of <5% and a remaining open porosity of <15% by volume and comprises the main crystalline phases $Si_3N_4$, SiC and $Si_2N_2O$, is eminently suitable as a substrate for semiconductor components. In this context, the low shrinkage makes it possible to obtain planar or specifically structured substrates without uncontrolled distortion and/or other damage, such as crack formation, distortion, etc.

Accordingly, the subject matter of the invention is a substrate based on silicon nitride for semiconductor components, characterized in that the substrate contains, as crystalline phases, silicon nitride ($Si_3N_4$), silicon carbide (SiC) and silicon oxynitride ($Si_2N_2O$), and the crystalline silicon content is $\leq 5\%$, based on the sum of the crystalline phases which are present, the shrinkage during production is <5% and the open porosity of the substrate is <15% by volume.

The crystalline silicon content is preferably $\leq 3\%$.

Crystalline phases and crystalline silicon are understood as meaning phases and silicon of this type which are detected by means of X-ray diffractometry.

The substrate according to the invention can be produced at relatively low temperatures. It is therefore possible to add a wide range of additives in order to deliberately influence or adjust very specific properties.

Materials based on $Si_3N_4$, SiC and $Si_2N_2O$, optionally with small residual amounts of silicon, are already known per se. For example, WO 00/32537 A2 describes a material which is produced by mixing silicon powder and $Si_3N_4$ powder with the addition of an organic silicon compound, shaping this mixture and heat-treating the resulting shaped body. The heat treatment is carried out in such a way that the phase level of silicon is <1%, the linear shrinkage is <5% and the remaining open porosity is $\leq 13\%$ by volume. The material composition and the procedure are aimed at providing oxidation-resistant materials and components which are able to withstand high temperatures, for example for turbines, combustion chambers or for processing metal melts. There is no indication that this material would be suitable or even advantageous as a substrate for semiconductor components.

However, the materials according to the invention are indeed eminently suitable as a substrate for semiconductor components, in particular since it is possible, by means of a suitable selection of the production process, to produce large-area substrates in a simple way. This leads to essential technical and economic advantages, since the further treatment of the substrate which is often required is significantly reduced or even rendered altogether superfluous.

In a particular embodiment of the substrates according to the invention, the latter contains sintering additives in a total concentration of <20% by weight, these sintering additives forming a liquid phase during production and being present in the substrate as an amorphous secondary phase or as complex further crystalline phases.

In principle, all sintering additives which are usually added to ceramics based on silicon nitride are suitable. The sintering additives are preferably $SiO_2$, alkaline earth metal oxides, oxides from group III B and IV B of the periodic system, including the rare earth oxides, V, Nb, Ta, Cr, Fe, Co and/or Ni Oxide, it being possible for said oxides to be used individually or in a mixture and/or in combination with $B_2O_3$, $Al_2O_3$ and/or $TiO_2$.

It is also possible for the substrate according to the invention to contain carbides, nitrides, carbonitrides, oxynitrides, silicides and/or borides of the elements Si, Al, Ti, Zr, Hf, V, Nb, Ta, Cr, Mo, W, Mn, Fe, Ca and/or Ni in concentrations of <10% by weight, calculated as the corresponding compound, the total content of these constituents not exceeding 10% by weight, preferably 5% by weight.

In a further embodiment, the substrate may contain carbides, nitrides, carbonitrides, silicides and/or borides of the elements Si, Ti, Zr, Hf, V, Nb, Ta, Cr, Mo, W, Mn and/or Fe as a further main crystalline phase in a concentration of $\geq 30\%$ by volume, preferably $\geq 35\%$ by volume, the substrate having an electrical conductivity of $\geq 0,1$ S/m.

The abovementioned carbides, nitrides, carbonitrides, oxynitrides, silicides and/or borides may be present in the substrate in their introduced form or as more complex additional crystalline phases. These additions can be used, for example, to influence the bonding of layers which have been applied to the substrate. The CTE of thin-film solar cells which are produced from the substrate according to the invention, the absorption of visible, infrared and ultraviolet light rays in such thin-film solar cells and the electrical conductivity can also be influenced by means of these additions.

The abovementioned carbides, nitrides, carbonitrides, oxynitrides, silicides and/or borides may, for example, be introduced as inorganic fibers, whiskers, platelets or particles and/or may be present in this form in the substrate.

It is also possible for the substrate according to the invention to contain carbon fibers which are present as such in the substrate or have partially or completely reacted to form more complex compounds.

A further subject of the invention is a process for producing the substrate according to the invention, in which the starting mixture is mixed intensively, shaped by pressing, slip casting, hot pressing, extrusion or tape casting, crosslinked and pyrolyzed under inert atmosphere and then nitrided.

If appropriate, sintering for further compaction may also take place after the nitriding.

The starting mixture is, for example, a mixture of silicon, silicon nitride and a silicon-organic polymer, it being possible for the content of the individual mixture components to vary within a relatively wide range. For example, the starting mixture may contain 15–90% by weight of silicon, 5 to 60% by weight of silicon nitride and 5 to 60% by weight of the silicon-organic polymer, preferably polysiloxane and/or polycarbosilane and/or copolymers of these compounds. Si contents of <15% by weight and $Si_3N_4$ contents of over 60% by weight lead to the reduction in porosity resulting from the nitriding of the Si to form $Si_3N_4$ no longer being sufficient to obtain a material with an open porosity of <15% by volume. This has an adverse effect on the mechanical properties of the material. Si contents of >90% by weight then only allow small concentrations of $Si_3N_4$ powder and silicon-organic polymer, with the result that the desired phase content which is responsible for the positive properties of the material is no longer established. This is also the reason for the specified lower limits $\geq 5\%$ by weight for the $Si_3N_4$ powder and the organic silicon compound. The upper limit for the silicon-organic polymer is fixed at 60% by weight. Higher levels would lead to high shrinkage levels and an undesirably high open porosity during pyrolysis.

The silicon-organic polymers used may additionally contain heteroatoms such as for example B, Ti, Zr and/or Al, which after the pyrolysis of the silicon-organic polymer react with matrix constituents or the gas atmosphere to form the corresponding oxides, carbides, nitrides and/or carbonitrides. The increases in volume which are generally associated with these reactions help to achieve the low open porosity of the material of <15% by volume in accordance with the invention. On the other hand, these new formations make it possible to set very specific properties, for example with regard to the electrical and/or tribiological properties and/or the wetting behavior with regard to liquids, such as for example lubricants or (metallic) melts.

To set specific properties, it is also possible to add corresponding inert materials, such as for example BN, TiN, $TiB_2$ or $MoSi_2$, as early as to the starting mixture. A wide range of substances are conceivable in this context, provided that they are thermodynamically stable under the reaction conditions in the presence of the base substances and neither adversely effect the possibility of achieving the desired phase content nor lose their specific properties as a result of reactions.

Furthermore, components, in particular carbides, nitrides, carbonitrides, oxynitrides, suicides and/or borides, can advantageously be introduced into the raw material mixtures according to the invention, which components, in the form of fibers, as short or long fibers, whiskers, platelets or particles, strengthen the materials. To achieve the advantageous low open porosity of <15% by volume in accordance with the invention, reinfiltration with the organic silicon compound and additional pyrolysis steps may be required in this context.

The starting substances are preferably in powder form. The silicon powder used advantageously has powder qualities with mean grain sizes of <20 $\mu$m. Powder qualities with main grain sizes of <3 $\mu$m are advantageously suitable as the silicon nitride powder.

The silicon-organic polymer used may advantageously be polysiloxanes, polysilazanes or polycarbosilanes or copolymers of these compounds. In addition to silicon, these compounds may contain carbon, nitrogen, hydrogen and/or oxygen, as well as further heteroatoms, such as for example boron, titanium, zirconium or aluminum.

The silicon-organic polymers used firstly have the function of a binder. This makes it possible to shape the starting mixture without having to add further organic additives, for example by tape casting, directly to form sheet-like substrates. On the other hand, they are broken down to form ceramic phases and reactants by pyrolysis in an inert atmosphere, and as a result are incorporated in the microstructural formation of the material.

Therefore, in the process according to the invention, the silicon-organic polymers are pyrolyzed, and in the following step of nitriding a complex reaction sequence, which first encompasses the nitriding of the silicon powder and secondly encompasses the reaction of the pyrolysis products of the silicon-organic compounds, results in the formation of a multiphase material which includes, as crystalline phases which can be detected by X-ray means, silicon nitride ($Si_3N_4$), silicon carbide (SiC) and Silicon oxynitride ($Si_2N_2O$), as well as possibly residual unreacted Si.

The intensive mixing and shaping of the starting mixture to form substrates may be carried out using various methods. The most simple embodiment in this context is for the raw materials Si powder, $Si_3N_4$ powder and a Si-organic polymer, which is present as a solid at room temperature, to be dry-mixed intensively, if appropriate with the addition of an organic, $H_2O$-free pressing oil, for the mixture to be sieved, for example via a sieve with a mesh width of 150 $\mu$m, and for the desired substrate to be shaped on a mechanical press. Further shaping processes described below are also possible following this dry mixing.

Better homogeneity of the resulting substrate can be achieved if the mixing takes place as wet milling using an organic, anhydrous solvent in which the silicon-organic polymer dissolves. This suspension is dried using suitable methods which are known per se, for example a rotary evaporator, spray drier, etc., and is once again safe, for example to <150 $\mu$m and shaped into the substrate blank using the pressing process described above or one of the shaping processes described below.

Hot kneading represents a further way of producing the starting mixture. In this case, the solid starting materials are heated in a suitable mixing unit, for example a heatable mechanical kneader with constant motion, to a temperature which is higher than the melting point of the silicon-organic component, with the result that a pasty consistency is established. After the pasty consistency has been reached, the kneading operation is continued and the heating is ended, with the result that the pasty raw-material mixture is converted into a pulverulent condition, and after sieving via a sieve, for example with a mesh width of 150 $\mu$m, this mixture can be used for the subsequent shaping of the substrate.

To convert the starting mixtures which have been produced into the shaped substrate, by way of example the following further processes can be used in addition to the dry pressing which has already been mentioned:

hot pressing, in which the starting mixture is introduced into a pressed mold which can be heated itself or indirectly. As a result of heating, the raw material granules are heated to a temperature which is higher than the melting point of the silicon-organic polymer, and then the required deformation pressure is applied or the compaction is continued until the desired blank thickness is reached. After the deformation, the entire system is cooled, with the result that the shaped substrate solidifies and can be removed from the press without being deformed.

extrusion, in which the dry raw material granules are heated, in a shaping machine which is known per se, for example a screw extruder, with intimate mixing, to a temperature which is higher than the melting point of the silicon-organic polymer and, at the same time, is fed toward a slot-shaped dye which has the desired width and thickness of the substrate. After it has emerged from the dye, the shaped material is placed onto a flat belt which is synchronized with regard to the extrusion rate and on which the substrate material is cooled and thereby solidified, so that it can then be cut and removed.

tape casting, in which preferably organic suspensions of the starting materials silicon, silicon nitride and the silicon-organic polymer in an organic solvent are used, the silicon-organic polymer being soluble in the organic solvent. In this technique, the suspension flows out of a storage vessel via a cutting system, continuously and in a controlled thickness onto a flat bench or a flat moving belt. The moving belt passes through drying devices, which lead to evaporation of the solvent and therefore to drying and solidification of the suspension, so that the cooled substrate material can finally be cut and removed.

The shaping of the starting mixture preferably takes place by tape casting.

In the case of shaping by means of tape casting, it is also possible, for example, for the solids suspension, in addition to the silicon-organic polymer, also to contain further organic additives as are customarily present for tape casting. Examples which may be mentioned include methyl ethyl ketone, polyvinyl butyral, dibutyl phthalate.

The tape-casting process is known per se in the ceramics sector for the production of $Al_2O_3$-, AlN and other substrates, but in this case organic polymers have to be deliberately added in order to solidify the suspensions, and these additives then have to be completely expelled again, since they cannot generally be pyrolyzed to form constituents of the material. A process of this type is described, for example, in Y. W. Kim (Mater. Res. Soc. Symp. Proc., 1993, Vol. 287, pp 265–270) for a $Si_3N_4$ material with $Y_2O_3$ and $Al_2O_3$ as sintering aid. In this case, an organic polymer which effects the dispersion of the solids and solidification therefor to form a substrate which can be handled when the solvent evaporates, is dissolved in an organic solvent. Before further processing, in this case by sintering, this polymer has to be burnt out again without leaving any residue.

By contrast, when the substrates according to the invention are produced by means of tape casting the silicon-organic polymer used does not have to be expelled. Its decomposition products react to $Si_3N_4$, SiC and/or $Si_2N_2O$, which are integral components of the substrate according to the invention. Surprisingly, it has been found that a mixture of organic solvent, silicon-organic polymer and pulverulent solid (silicon, silicon nitride and if appropriate desired additives), given sufficient homogenization, can be set on its own or if necessary by the addition of the abovementioned further organic additives to a viscosity which allows the mixture to be processed by means of tape casting. The bonding power of the silicon-organic polymer following evaporation of the organic solvent is sufficient to obtain blank substrates which can be handled and fed for further processing.

It is surprising that a mixture of organic solvent, silicon-organic polymer and pulverulent solid (silicon, silicon nitride and if appropriate desired additives) can be processed into sheet-like substrates of the composition according to the invention by tape casting even without the addition of further organic polymers. The process engineering benefits which are associated with this fact have already been described above.

Following the shaping process, the shaped substrates can be crosslinked, for example at temperatures of $\leq 250°$ C., in order to ensure that the silicon-organic polymer cannot be melted, pyrolyzed at temperatures of $\leq 1200°$ C. and then nitrided at temperatures of $\leq 1500°$ C.

The nitriding takes place in a nitrogen-containing gas atmosphere. In addition to nitrogen, the reaction gas may additionally contain gaseous hydrogen and/or ammonia. The nitriding reaction may take place both under standard pressure and under elevated gas pressure, preferably from 1 to 100 bar. The maximum temperatures for this nitriding reaction are advantageously 1300 to 1600° C. The temperature/time curve for the nitriding reaction is to be matched to the specific prevailing conditions, such as for example furnace size and component volume.

Operating this process under elevated $N_2$ pressure represents a specific embodiment of the nitriding. In this way, the reaction rate can be accelerated, the rate of conversion of the silicon to $Si_3N_4$ can be increased and the overall process times can be shortened, resulting in significant economic benefits.

The nitriding is preferably carried out at temperatures of <1500° C. under $N_2$ pressure, or in a specific embodiment at $N_2$ pressures of between 1 and 100 bar.

Heating rates of $\leq 100$K/h are advantageously selected for crosslinking, pyrolysis and nitriding.

These process steps preferably take place in an inert atmosphere, for example in the presence of nitrogen.

A further specific embodiment provides for sintering after the nitriding, which can take place at temperatures of $\leq 1800°$ C. under 1–100 bar of $N_2$ or at temperatures of >1800° C. under elevated $N_2$ pressure of from 10 to 2000 bar.

The process steps of crosslinking, pyrolysis, nitriding and if appropriate sintering can be carried out in a single suitable furnace, but it is in fact advantageous to use different furnace installations which are each optimized to the corresponding temperature ranges.

The substrates according to the invention are versatile in use. By way of example, they can be used to fabricate semiconductor components. In particular, the substrates according to the invention are suitable for the production of thin-film solar cells.

For this purpose, by way of example, first of all one or more silicon layers are deposited on the substrate. Then, the coated substrate can be processed further by subsequent process steps (e.g. diffusion, implantation, oxidation) or the application of interconnects to form semiconductor components, preferably thin-film solar cells.

However, it is also possible for these substrates to be used for special applications in electronics, optics and general mechanical engineering.

The subject matter of the invention also encompasses semiconductor components which include a substrate according to the invention. The semiconductor component is preferably a thin-film solar cell.

To fabricate the semiconductor components according to the invention, by way of example, the procedure may be that one or more crystalline silicon layers are deposited on the substrate by means of chemical vapor deposition (CVD) or liquid-phase epitaxy (LPE). The substrate temperatures in the case of deposition by CVD are, for example, between 900° C. and 1300° C., preferably between 1100° C. and 1200° C. In a CVD-reactor, a mixture of trichlorosilan or silane with a doping gas, for example containing diborane, borane, aluminum-containing and/or gallium-containing metal-organic compounds diluted in hydrogen, is passed over the substrate in a known way. The layer growth rate is 1–10 $\mu$m/min.

The deposition temperatures for the LPE are, for example, 500° C. to 1000° C., preferably 800° C. to 1000° C. In this case, a metal melt enriched with silicon and desired doping metals is applied to the substrate, and silicon layer growth takes place from the melt. In both deposition processes, the grain size is usually only a few 10 $\mu$m.

Since such a finely crystalline silicon layer is not suitable for solar cells, the grain size has to be increased. This usually takes place using a liquid-phase zone melting process. For this purpose, the nucleation layer is melted, for example, at approximately 1420° C. in a narrow strip down to the ceramic surface, and the liquid zone is drawn uniformly over the specimen. After crystal nuclei have formed through spontaneous nucleation, in this way lateral overgrowth of the amorphous intermediate layer takes place. A layer with large grains with a width of a few millimeters and a length of a few centimeters is formed from the finely crystalline layer.

It is also possible for one or more additional layers, known as barrier layers, to be applied between the substrate and the silicon layers. The additional layers are preferably silicon nitride, silicon oxide or silicon carbide layers or a combination of these layers. These additional layers are applied in a manner which is inherently known per se. They can be applied, for example, by plasma-enhanced chemical vapor deposition. The substrate temperature is in this case, for example, between 200° C. and 800° C., preferably between 300° C. and 400° C. To produce a silicon nitride layer, silane and nitrogen are passed over the specimen in the plasma, while to produce silicon oxide, silane and nitrous oxide are passed over the specimen in the plasma.

The application of the intermediate layers serves firstly to prevent contaminations from passing from the substrate into the photovoltaically active layer and secondly makes it possible to better match the substrate properties to the properties of the deposited silicon layers, for example conductivity, bonding, diffusion barrier. When using the substrates according to the invention, however, it is also possible for the substrate properties to be matched to the properties of the silicon layers in a very simple way by adjusting the substrate properties themselves, since the substrate properties can be varied within wide limits by varying the composition of the substrate and by targeted addition of suitable substances.

It is then possible to fabricate semiconductor components, in particular thin-film solar cells, from the coated substrate in a known way. By way of example, in this context the procedure is such that phosphorus is defused into the boron-doped silicon layer. This usually takes place at a diffusion temperature of from 700° C. to 1000° C., preferably at 800° C. to 850° C. in a $POCl_3$ gas stream in a tubular diffusion furnace. After the diffusion, the phosphorus glass which has formed has to be removed using an etching mixture which contains hydrofluoric acid. Then, an antireflection coating consisting of titanium dioxide and/or magnesium fluoride or silicon nitride is applied in a vacuum vapor deposition installation or a plasma-enhanced chemical vapor deposition. Other application methods, such as spraying, doctor-blade application or the like are also possible.

Then, contacts are applied. If an insulating ceramic substrate is used, the contacts are applied to the front surface of the coated substrate, while if a conductive ceramic substrate is used, the contacts are applied to the front and back surfaces. To apply the contacts, metal-containing pastes are printed on or metals are spluttered on, so that a comb-shaped grid of contacts is formed on the front surface, while the back surface can be printed over its entire surface or in grid form. The contacts are then fired in at a temperature of, for example, 500° C. to 1000° C., preferably from 650° C. to 750° C., in order to allow a low-resistance transition between semiconductor metal or ceramic and metal.

The structure of a thin-film solar cell based on an insulating ceramic structure is diagrammatically depicted in FIG. 1. There is a barrier layer (4) on the insulating ceramic substrate (5). This is followed by a boron-doped layer (3), a phosphorus-doped layer (2) and finally an antireflection coating (1). The contacts are designed as front-surface contacts (6), contact being made with both the boron-doped layer (3) and the phosphorus-doped layer (2).

Figure 2:
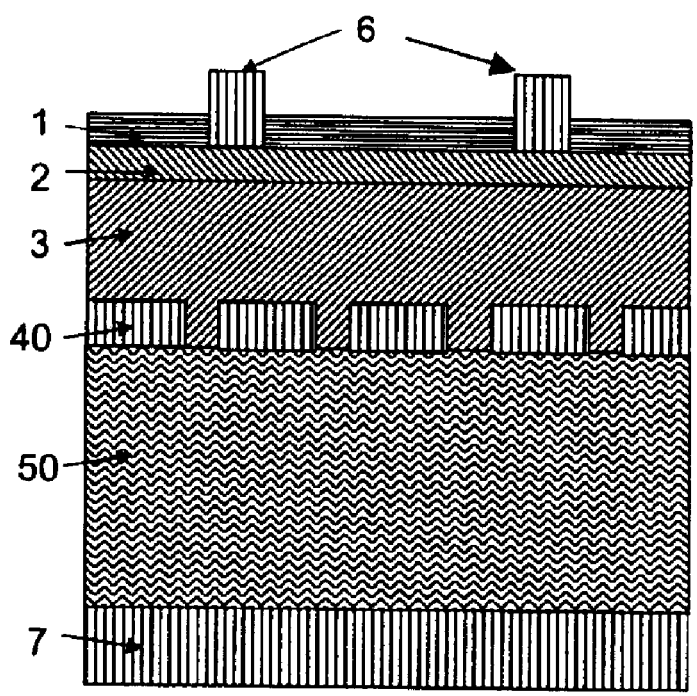

The structure of a thin-film solar cell based on a conductive ceramic substrate is diagrammatically depicted in FIG. 2. A perforated barrier layer (40) has been applied to the conductive ceramic substrate (50). This is followed by a boron-doped layer (3), a phosphorus-doped layer (2) and finally an antireflection coating (1). The contacts are designed as front-surface contacts (6) and back-surface contact (7), the front-surface contacts (6) being applied to the phosphorus-doped layer (2).

The thin-film solar cells which are produced on the basis of the substrate according to the invention are distinguished by high efficiencies of, for example, 9.4%. Moreover, the thin-film solar cells can also be produced at low cost on a large industrial scale, since the substrates according to the invention can be very easily obtained in the required sheet-like shape of suitable size, in particular by tape casting.

The invention is explained in more detail with reference to the following examples. However, the examples merely represent embodiments and are not intended to be understood and constituting any restriction to the idea on which the invention is based.

EXAMPLES

Example 1

Comparative Example 1000 g of silicon powder with a mean particle size of 3 μm, e.g. HCST Grade A10 produced by H. C. Starck GmbH & Co KG and 500 g of a methylpolysiloxane, e.g. NH2100 produced by Nünchritz, were mixed for 10 h in isopropanol so as to establish a solid content of 30% by weight in a milling drum with $Si_3N_4$ milling balls on a roll stand, the milling balls were separated out and the solvent isopropanol was removed by distillation. The resulting dried material was dried in air in a drying cabinet at at most 80° C. and was pulverized again in a milling drum with $Si_3N_4$ milling balls on a roll stand. The result was material in dust form which was sieved via a sieve with a mesh width of 100 μm. The underflow was pressed on an axial press in a steel mold using pressures of $\geq 10$ $kN/cm^2$ to form substrates with a surface area of 100×100 mm and a thickness of approx. 2 mm. These substrates were crosslinked by heating at up to 3 K/min to approx. 250° C. with $N_2$ purging, were pyrolyzed by further heating to 900° C. under 1 bar of $N_2$ and were nitrided by continuing this heating to 1450° C. under 1 bar of $N_2$.

The change in weight and dimensions, the density (Archimedes principle following $H_2O$ saturation), the open porosity (and the pore size distribution) were determined by Hg pressure porosimetry, and the level of crystalline phases was determined by X-ray diffraction, on the solidified substrate produced in this way.

The characteristic values determined on this substrate are compiled in Table 1. While the shrinkage and the main crystalline phases correspond to the criteria of the invention, the open porosity is well above the limit value of 15% by volume, and the crystalline silicon phase content is above 5%.

Coating experiments for the production of thin-film solar cells were carried out. In these experiments, as described in Example 7, a $SiO_2$-$Si_3N_4$-$SiO_2$ barrier layer was applied to the substrate. Then, a silicon nucleation layer was applied by CVD. The subsequent liquid-phase zone melting led to reactions between the coating substances and the substrate material and, for this reason, to poor bonding of and/or damage to the coating. Consequently, substrates produced in accordance with Example 1 are unsuitable for the fabrication of semiconductor components.

Example 2a 900 g of silicon powder with a mean particle size of 3 μm, e.g. HCST Grade A10 produced by H. C. Starck GmbH & Co KG, 500 g of a methylpolysiloxane, e.g. NH2100 produced by Nünchritz and 600 g $Si_3N_4$ powder with a mean particle size of 0,7 μm and a N content of >38% by weight, e.g. HCST-M11, were prepared as described in Example 1. However, the shaping to form the same substrate size took place by hot pressing at 160° C. The further processing was carried out analogously to Example 1. The resulting characteristic variables are compiled in Table 1.

Coating experiments analogous to those in Example 1 were carried out. The bonding and integrity of layers applied by vapor deposition was good, and consequently the material was suitable for the fabrication of semiconductor components.

Example 2b

The identical starting batch to Example 2a was shaped into substrates by hot pressing under conditions identical to Example 2a, was crosslinked under $N_2$ purging and pyrolyzed. Unlike in the procedure described in Example 1 and Example 2a, nitriding was carried out by heating to 1370° C. under 95 bar of $N_2$. The density and open porosity (cf. Table 1) of the nitrided substrate of this embodiment change only slightly compared to Example 2a, but the residual free silicon content drops below the X-ray detection limit after just 50% of the reaction time compared to Example 2a.

Coating experiments analogous to Example 1 were carried out. The bonding and integrity of layers applied by vapor deposition was good, and consequently the material was suitable for the fabrication of semiconductor components.

Example 3

The identical starting batch to Example 2a was prepared not in isopropanol, as described in Example 1, but rather in hexane, and the solids content, based on the insoluble powder constituents, was 60% by weight. Homogenization was carried out as described in Example 1. This was not followed by evaporation, but rather the suspension was sieved directly via a sieve with a mesh width of 50 μm, degassed in a desecrator with stirring, heated to 60° C. and processed on a laboratory tape casting installation. This resulted in substrates that were very uniform in terms of thickness and surface condition, which were treated further in accordance with Example 1.

The resulting characteristic variables are compiled in Table 1 and correspond to the criteria according to the invention.

Coating experiments analogous to Example 1 were carried out. The bonding and integrity of layers applied by vapor deposition was good, and consequently the material was suitable for the fabrication of semiconductor components.

Example 4

900 g of silicon powder, 500 g of methylsiloxane and 500 g of $Si_3N_4$ powder in accordion with Example 2a, and additionally 100 g of $Y_2O_3$, 50 g of $Al_2O_3$ and 70 g of $MgAl_2O_4$, the additives having finenesses with mean particles sizes of <1 μm and purities of >98%, were prepared analogously to Example 1 and processed into substrates analogously to Example 2a. These parts, which were consolidated by nitriding, were additionally sintered at 1750° C. under 2 bar of $N_2$, with the result that the material was consolidated further and it was no longer possible to detect any open porosity (Table 1).

The resulting characteristic variables are compiled in Table 1 and correspond to the criteria of the invention.

Coating experiments analogous to Example 1 were carried out. The bonding an integrity of layers applied by vapor deposition was good, and consequently the material was suitable for the fabrication of semiconductor components.

Example 5

40 g of WC powder with a mean particle size of <2 μm and a purity of ≧96% was additionally added to the identical starting batch to Example 2a, the materials were prepared as described in Example 1 and were shaped and processed further as was described in Example 2a. It was found that the WC reacted during the nitriding to form $WSi_2$ and the substrate had a deep black color.

The resulting characteristic variables are compiled in Table 1 and correspond to the criteria of the invention.

Coating experiments analogous to Example 1 were carried out. The bonding and integrity of the layers applied by vapor deposition was good, and consequently the material was suitable for the fabrication of semiconductor components.

Example 6

700 g of TiN powder with a mean particle size of <2 μm and a N content of >20% by weight, for example HCST Grade C, were additionally added to the identical starting batch to Example 2a. These starting materials were prepared as described in Example 1 and shaped and processed further as described in Example 2a, except that the nitriding temperature was selected to be different from the above-mentioned examples, at 1380° C. under 1 bar of $N_2$. The TiN formed a percolation structure in the nitrided material, resulting in a high electrical conductivity >1 S/m. Furthermore, this structure promotes the nitriding. Even at the lower nitriding temperature compared to Examples 1 and 2a, it was not possible to detect any free silicon in the substrate by X-ray means.

The resulting characteristic variables are compiled in Table 1 and correspond to the criteria of the invention.

Coating experiments analogous to Example 1 were carried out. The bonding and integrity of layers applied by vapor deposition was good, and consequently the material was suitable for the fabrication of semiconductor components.

TABLE 1

| Example: | | 1 | 2a | 2b | 3 | 4 | 5 | 6 |
|---|---|---|---|---|---|---|---|---|
| Starting composition | | Si powder, MPS* | Si powder SN powder, MPS* | Si powder, SN powder, MPS* | Si powder, SN powder, MPS* | Si powder, SN powder, MPS*, $Y_2O_3$, $Al_2O_3$, $MgAl_2O_4$ | Si powder, SN powder, MPS*, WC | Si powder, SN powder MPS*, TiN |
| Shaping | | dry pressing | hot pressing | hot pressing | tape casting | hot pressing | hot pressing | hot pressing |
| Shrinkage | % | 0.8 | 1.5 | 1.5 | 2.5 | 4.8 | 1.8 | 3.4 |
| Density | g/cm³ | 2.25 | 2.55 | 2.60 | 2.48 | 3.04 | 2.58 | 2.78 |
| Open porosity | Vol.-% | 22 | 11 | 9 | 13 | 0 | 11 | 12 |
| Phase fraction: | $Si_3N_4$ | pres.[1] | pres.[1] | pres.[1] | pres.[1] | pres.[1] | pres.[1] | pres.[1] |
| | SiC | pres. | pres.[1] | pres.[1] | pres.[1] | pres.[1] | pres.[1] | pres.[1] |
| | $Si_2N_2O$ | pres.[1] | pres.[1] | pres.[1] | pres.[1] | pres.[1] | pres.[1] | pres.[1] |
| | other | — | — | — | — | amorphous phase | WSi phases | TiN |
| Si-content | % | 6 | 2 | n.d.** | 2 | n.d.** | 2 | n.d.** |
| Notes | | | standard-nitriding | pressure-nitriding | | sintered | | |
| According to the invention: | | no | yes | yes | yes | yes | yes | yes |

*: Methyl-polysiloxane[1]: present

**n.d.: not detectable

Example 7

(Solar Cell Production)

A silicon nitride substrate which had been produced as described in Example 4 was firstly provided with a barrier layer comprising silicon oxide/silicon nitride/silicon oxide with thicknesses of 1 μm, 0.1 μm and 1 μm. The barrier layer was deposited by plasma-enhanced vapor deposition. The substrate temperature was 350° C. To produce the silicon nitride layer, silane and nitrogen were passed over the specimen in the plasma, while silane and nitrous oxide were passed over the specimen in the plasma in order to produce the silicon oxide layers.

The coated substrate was then provided with an approximately 10 μm thick fine-crystalline (grain size approximately 30 μm) boron-doped silicon layer by means of chemical vapor deposition. For this purpose, the substrate which had been coated with the barrier layer was heated to 950° C. in a CVD reactor and treated with a gas mixture consisting of 10/min of nitrogen, 10 g/min of trichlorosilane and 0.1 l/min of diborane.

Then, a liquid-phase recrystallization step was carried out in order to increase the size of the grains. For this purpose, the silicon layer was melted at 1420° C. in a narrow strip of a few millimeters down to the ceramic surface and the liquid zone was drawn uniformly at approximately 10 mm/min over the specimen. At the edge of the substrate, crystal nuclei were formed by spontaneous nucleation and then led to lateral overgrowth of the intermediate layer. After the remelting, the grains, had a width of a few millimeters and a length of a few centimeters. This remelted boron-doped silicon layer was then thickened to a layer thickness of approximately 30 μm by means of a second CVD step at 1200° C. using a gas mixture as described above.

Thin-film solar cells were produced in a known way from the substrate which had been coated in this way. The procedure was that phosphorus was diffused into the boron-doped silicon layer at 820° C. in a tubular diffusion furnace. After the diffusion, the phosphorus glass formed was removed using an etching mixture containing hydrofluoric acid. Then, an antireflection layer consisting of titanium dioxide and magnesium fluoride was applied in a vacuum vapor deposition installation.

Then, the surface of the solar cell was fixed at 1 cm² by means of photolithography. The solar cell was protected by a photoresist, while the area around the solar cell was etched away to a depth of approximately 5 μm so that the boron-doped layer was exposed.

Contacts were then vapor-desposited onto the front surface, so that contact was made with both the phosphorus-doped layer and the boron-doped layer. The contacts were then fired in at a temperature of approximately 650° C. The solar cell achieved an efficiency of 9.4%.

What is claimed is:

1. A substrate based on silicon nitride, for semiconductor components, comprising:
    (a) as crystalline phases:
        silicon nitride ($Si_3N_4$);
        silicon carbide (SiC); and
        silicon oxynitride ($Si_2N_2O$); and
    (b) sintering additives in a total concentration of less than 20% by weight, which additives form a liquid phase during production and are present in the substrate in a form selected from the group consisting of an amorphous secondary phase, and as complex additional crystalline phases,
    wherein said substrate has,
        a crystalline silicon content of ≦5%, based on the sum of the crystalline phases which are present,
        a shrinkage during production of <5%, and
        an open porosity of <15% by volume.

2. The substrate of claim 1, wherein the sintering additives are selected from the group consisting of $SiO_2$, alkaline earth metal oxides, oxides from group III B and IV B of the periodic system, rare earth oxides of at least one of V, Nb, Ta, Cr, Fe, Co Ni oxide, $B_2O_3$, $Al_2O_3$, $TiO_2$, and combinations thereof.

3. The substrate of claim 1, wherein the substrate further comprises at least one member selected from the group consisting of carbides, nitrides, carbonitrides, oxynitrides, silicides and borides of at least one element selected from the group consisting of Si, Al, T, Zr, Hf, V, Nb, Ta, Cr, Mo, W, Mn, Fe, Ca and Ni, said member being present in a concentration of <10% by weight, based on total weight of said substrate.

4. The substrate of claim 1, wherein the substrate further comprises at least one of carbides, nitrides, carbonitrides, silicides and borides of an element selected from the group consisting of Si, Ti, Zr, Hf, V, Nb, Ta, Cr, Mo, W, Mn, Fe and combinations thereof, as a further main crystalline phase in concentration of >30% by volume, and said substrate has an electrical conductivity of $\geq 0.1$ S/m.

5. The substrate of claim 3, wherein said member is present in a form selected from the group consisting of inorganic fibers, inorganic whiskers, inorganic platelets and inorganic particles.

6. The substrate of claim 3, wherein the substrate further comprises carbon fibers, which are present as such in the substrate or have partially or completely reacted to form more complex compounds.

7. A semiconductor component which comprises the substrate of claim 1.

8. The semiconductor component of claim 7, wherein one or more crystalline silicon layers are deposited on the substrate.

9. The semiconductor component of claim 8, wherein one or more additional layers are applied between the substrate and the silicon layers.

10. The semiconductor component of claim 9, wherein the additional layers are silicon nitride, silicon oxide or silicon carbide layers.

11. The semiconductor component of claim 7, wherein the semiconductor component is a thin-film solar cell.

* * * * *

UNITED STATES PATENT AND TRADEMARK OFFICE
CERTIFICATE OF CORRECTION

PATENT NO. : 6,916,560 B2
DATED : July 12, 2005
INVENTOR(S) : Gerhard Wötting et al.

It is certified that error appears in the above-identified patent and that said Letters Patent is hereby corrected as shown below:

Column 14,
Line 54, insert the word -- or -- between "Co" and "Ni".

Signed and Sealed this

Fourth Day of October, 2005

JON W. DUDAS
*Director of the United States Patent and Trademark Office*